(12) United States Patent
Bhakta et al.

(10) Patent No.: US 6,605,517 B1
(45) Date of Patent: Aug. 12, 2003

(54) METHOD FOR MINIMIZING NITRIDE RESIDUE ON A SILICON WAFER

(75) Inventors: Jayendra D. Bhakta, Sunnyvale, CA (US); Krishnashree Achuthan, San Ramon, CA (US); Angela Hui, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/150,282

(22) Filed: May 15, 2002

(51) Int. Cl.[7] .................. H01L 21/76; H01L 21/425
(52) U.S. Cl. .................. 438/424; 438/524; 438/439
(58) Field of Search ................... 438/424, 524, 438/439

(56) References Cited

U.S. PATENT DOCUMENTS

| | | | |
|---|---|---|---|
| 4,355,974 A | * | 10/1982 | Lee |
| 6,146,928 A | * | 11/2000 | Ishiguro et al. |
| 6,296,710 B1 | * | 10/2001 | Allen et al. |

* cited by examiner

*Primary Examiner*—John F. Niebling
*Assistant Examiner*—Stanetta Isaac
(74) *Attorney, Agent, or Firm*—Winstead Sechrest & Minick P.C.

(57) ABSTRACT

A method for reducing nitride residue from a silicon wafer during semiconductor fabrication. The wafer includes a nitride mask defining active regions and isolation regions wherein the isolation regions are formed by trenches. The method includes providing an optimized oxide deposition process in which a temperature gradient of a CVD chamber is improved by performing the following steps. First, at least one silicon wafer is placed into the chamber on a quartz boat having an increased slot size, preferably at least 6 mm. Second, the quartz boat is centered in approximately a center of the chamber so that the wafer is located in a center section of the chamber to avoid the temperature gradient at the ends of the chamber, such that when oxide gas is injected onto the wafer, an oxide layer having a substantially uniform thickness is formed on the wafer. The method further includes performing an optimized polishing process on the oxide wherein the oxide is polished down to approximately a level of the nitride, but where more of the oxide is removed from the edge area of the wafer than in the center area. Thereafter, the nitride is stripped from the wafer, wherein substantially all of the nitride is removed from the wafer, thereby minimizing nitride residue.

6 Claims, 4 Drawing Sheets

METHOD FOR MINIMIZING NITRIDE RESIDUE ON A SILICON WAFER

FIELD OF THE INVENTION

The present invention relates to semiconductor processing, and more particularly to a method for minimizing nitride residue on a silicon wafer using a uniform oxide deposition followed by an optimized isolation oxide polish.

BACKGROUND OF THE INVENTION

Transistor memory arrays are typically fabricated on a silicon wafer. The process usually begins by depositing a layer of pad oxide on the wafer substrate. Typically, the pad oxide is 150–250Å thick. A nitride mask is then deposited over the pad oxide and etched to define active regions on the silicon substrate. An isolation technology is then used to create isolation regions between the active regions to electrically isolate the active regions from one another. In shallow trench isolation (STI) for example, shallow trenches are etched into the silicon substrate in the openings in the nitride mask between the active regions. A liner oxidation process is then performed in the trenches in which a thin layer of oxide is grown. Next, an oxide such as TEOS (tetraethyl orthosilicate) or HDP (high-density plasma) is deposited over the silicon substrate and is then polished back so that it remains only in the trenches, its top surface level with the nitride mask. After the oxide is etched back, the nitride mask is stripped to expose the pad oxide. Thereafter, layers of polysilicon are patterned to define stacked gate structures and word lines for the semiconductor device.

Unfortunately, the conventional processes for depositing and polishing the oxide, and for removing the nitride from the wafer may result in the formation of faulty devices. The oxide is deposited on the wafer using a low-pressure chemical vapor deposition system (LPCVD) in which gasses continuously flow into a reaction chamber holding the wafer where deposition occurs. The LPCVD deposition, however, results in a non-uniform layer of oxide on the wafer due to an edge to center temperature gradient and depletion of reactive gasses in the chamber.

FIG. 1A is a top view of a silicon wafer 10 after oxide deposition with cross-sectional views showing the center area of the wafer 10 and the edge area of the wafer 10, respectively. The dotted lines in the top view are graphical representations of trench isolation areas 12 beneath the layer of isolation oxide 14, which is shown in the cross-sectional views deposited over the nitride mask 16 to fill the trenches 12. During oxide deposition, more of the oxide gas reacts on the surface of the wafer 10 along the edge area, while less of the oxide gas reaches the center area of the wafer 10, resulting in the oxide being approximately 100–200Å thicker in the edge area of the wafer 10 compared to the center area. This difference in oxide thickness is shown graphically by the arrows. For a 200 mm wafer, for example, the edge area of the wafer where the oxide becomes non-uniform may be 5–20 mm in size, while the center area may be 195–180 mm in size.

After the isolation oxide 14 is deposited, the oxide 14 is polished down to the top level of the nitride 16. Once goal of the polishing process is to cease polishing just before the nitride layer is encountered, which in the ideal case would leave a thin skin of oxide 14 above the nitride. The next step is to remove this thin skin of oxide 14 by way of an HF dip etch. Because of the non-uniformity in the thickness of the oxide 14, however, more oxide 14 will remain in the edge area of the wafer 10 than in the center after polishing, and the HF dip etch will fail to remove all of the oxide 14 in the edge area of the wafer 10.

After the dip etch, the nitride is stripped from the wafer 10 with a bath of hot phosphoric acid and, which does not attack oxide 14. FIG. 1B is a top view of the wafer 10 after the nitride strip. Because the acid does not affect the oxide 14, if there is any oxide 14 remaining on top of the nitride 16, the nitride 16 will not be removed under these areas, leaving nitride residue 18 in the edge area of the wafer 10. The problem with nitride residue 18 is that it will block formation of the subsequent transistor structures and cause defects in the memory array.

Accordingly what is needed is method for minimizing nitride residue on a silicon wafer. The present invention addresses such a need.

SUMMARY OF THE INVENTION

The present invention provides a method for reducing nitride residue from a silicon wafer during semiconductor fabrication. The wafer includes a nitride mask defining active regions and isolation regions wherein the isolation regions are formed by trenches. The method includes providing an optimized oxide deposition process in which a temperature gradient of a CVD chamber is improved by performing the following steps. First, at least one silicon wafer is placed into the chamber on a quartz boat having an increased slot size, preferably at least 6 mm. Second, the quartz boat is centered in approximately a center of the chamber so that the wafer is located in a center section of the chamber to avoid the temperature gradient at the ends of the chamber, such that when oxide gas is injected onto the wafer, an oxide layer having a substantially uniform thickness is formed on the wafer. The method further includes performing an optimized polishing process on the oxide wherein the oxide is polished down to approximately a level of the nitride, but where more of the oxide is removed from the edge area of the wafer than in the center area. Thereafter, the nitride is stripped from the wafer.

According to the present invention, because all of the oxide is removed, substantially all of the nitride can be removed from the wafer during the nitride strip, thereby minimizing nitride residue and increasing the reliability of the resulting semiconductor devices.

DETAILED DESCRIPTION

The present invention relates to a method for reducing nitride residue on a silicon wafer during semiconductor device fabrication. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown but is to be accorded the widest scope consistent with the principles and features described herein.

The present invention provides a method for minimizing nitride residue on a silicon wafer during semiconductor fabrication. The method improves upon the current process by increasing the planarity of the insulating oxide across the entire wafer, and by optimizing the oxide polishing process to remove more oxide material from the edge of the wafer. According to one aspect of the present invention, the planarity of the of the oxide is increased through an optimized oxide deposition process in which the temperature gradient of CVD chamber is improved, which in turn, provides a layer of oxide on the wafer that has a more uniform thickness. By optimizing both the oxide deposition process and the oxide polish, it is ensured that substantially all of the oxide will be removed from the nitride before the nitride is stripped such that virtually all of the nitride will be removed during the wet etch, thus minimizing, if not eliminating, any nitride residue.

Figure 1A:
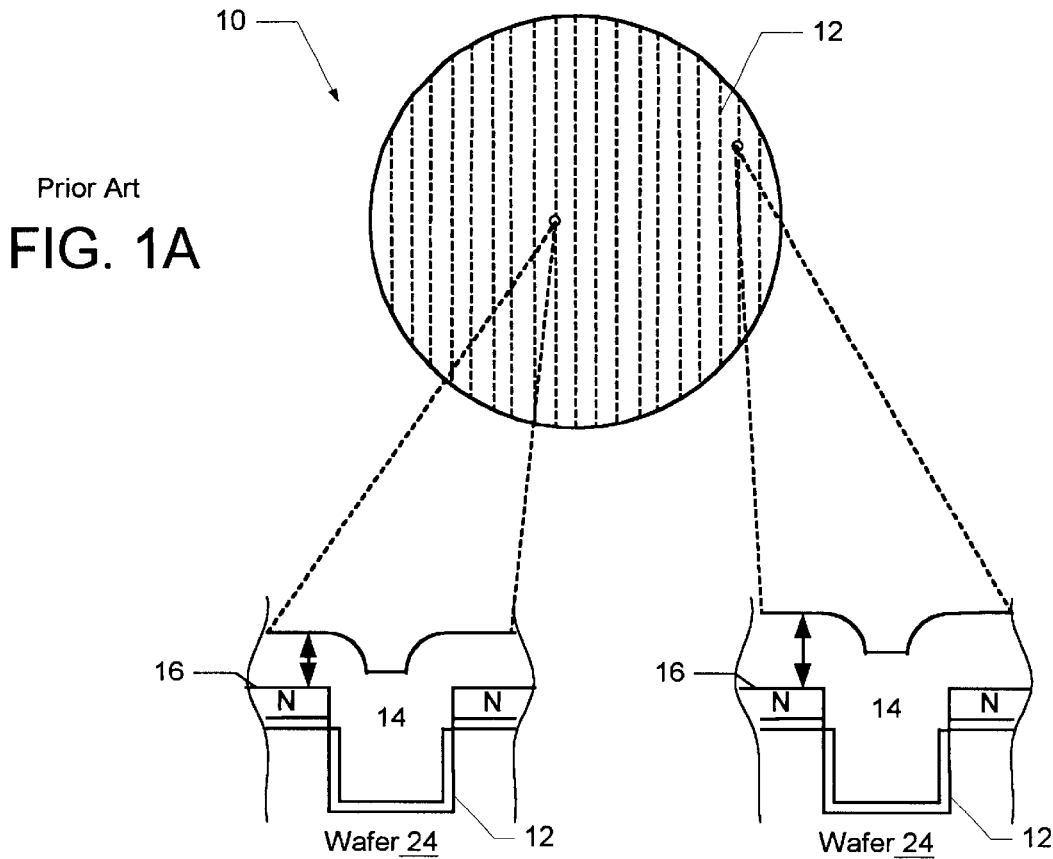
FIG. 1A is a top view of a silicon wafer after oxide deposition with cross-sectional views showing the center area of the wafer and the edge area of the wafer, respectively.
Figure 1B:
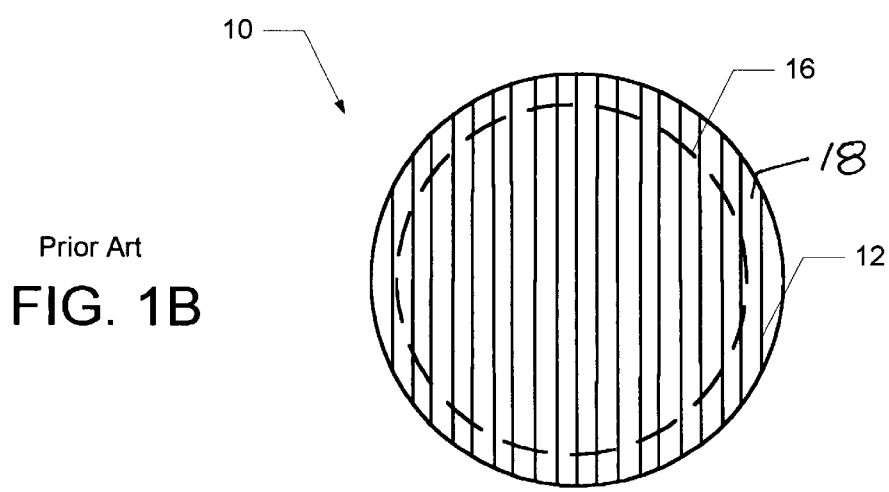
FIG. 1B is a top view of the wafer after a nitride strip.
Figure 2:
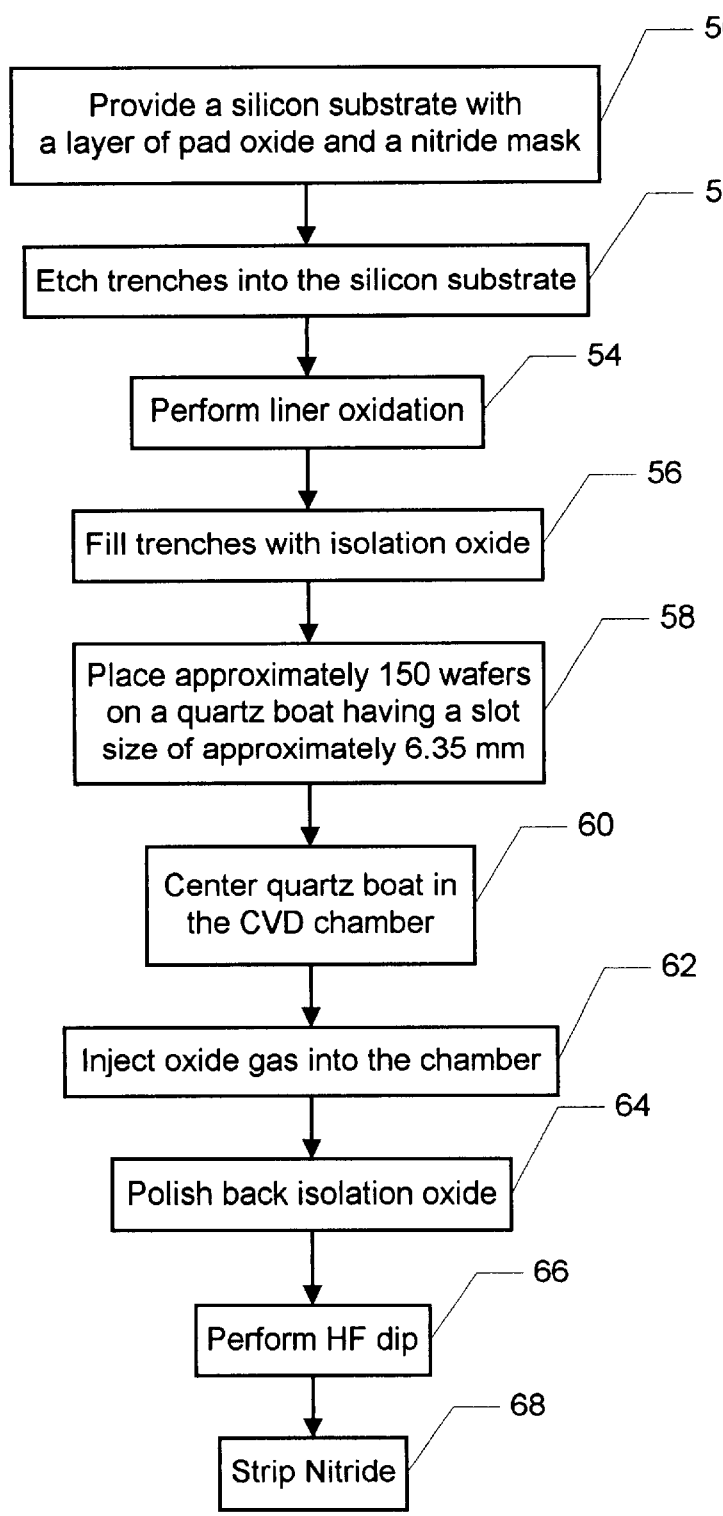
FIG. 2 is a flow chart illustrating the process for minimizing nitride residue in accordance with one preferred embodiment of the present invention.

FIG. 2 is a flow chart illustrating the process for minimizing nitride residue in accordance with one preferred embodiment of the present invention; and FIGS. 3A–3G are diagrams graphically illustrating the steps described in FIG. 2.

Figure 3A:
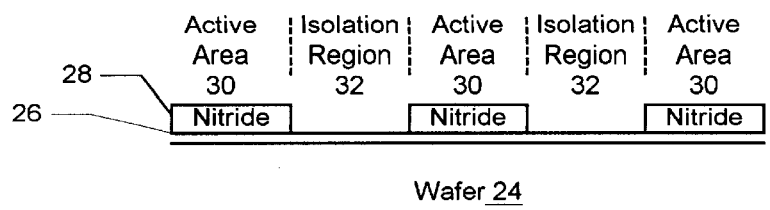
FIGS. 3A–3G are diagrams graphically illustrating the steps described in FIG. 2
Figure 3B:
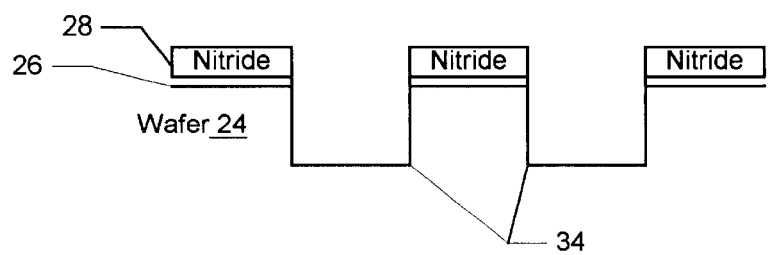
Figure 3C:
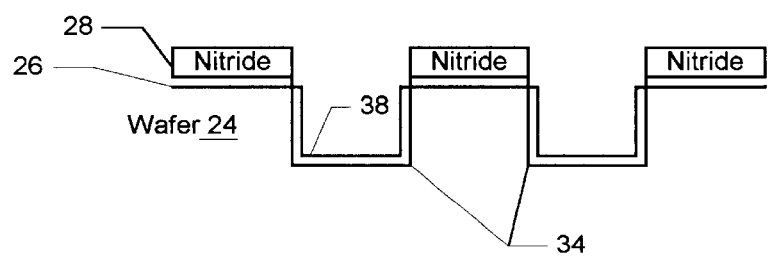

The process begins in step 50 by providing a silicon wafer 24 with a layer of pad oxide 26 ($S_1O_2$) followed by a masking material, such as a layer of silicon nitride 28 that defines active regions 30 and isolation regions 32 on the wafer 24 (FIG. 3A). Trenches 34 are then etched into the silicon wafer 24 using the nitride 28 as a mask in step 52 (FIG. 3B). After trench formation, a liner oxidation is performed in step 54 in which a thin layer of oxide 38 is grown in the trenches 34 (FIG. 3C).

After the liner oxidation, an isolation oxide, such as TEOS (tetraethyl orthosilicate) or HDP (high-density plasma), must be deposited over the wafer 24 to fill-in the trenches 34. According to the present invention, an optimized oxide deposition process is utilized to provide an oxide layer that has increased planarity from the edge area of the wafer to the center area of the wafer. This is accomplished via steps 58–62.

As stated above, the conventional method of using a low-pressure chemical vapor deposition system (LPCVD) to deposit oxide on the wafer, results in a non-uniform layer of oxide on the wafer. The Applicants of the present invention have recognized that the conventional LPCVD method has two major drawbacks. First, approximately 200 wafers are loaded in the LPCVD chamber using a quartz boat having slots for holding the wafers that very closely spaced, normally 5.2 mm. With such close spacing, the circulating gases in the chamber have less wafer 24 surface area to react with, resulting in non-uniform deposition of the oxide. Second, LPCVD chambers typically have higher temperatures in the end sections of the chamber than in the center section to increase reaction rates. Although, this temperature gradient in the chamber increases reaction rates at the ends of the chamber, it also decreases the uniformity of the deposition from the edge of the wafers 24 to the center for the wafers 24 located at either end of the chamber.

Figure 3D:
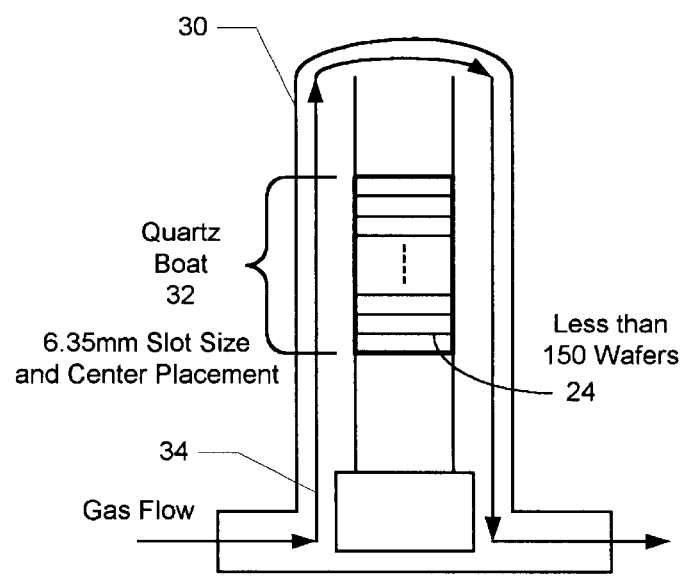
Figure 3E:
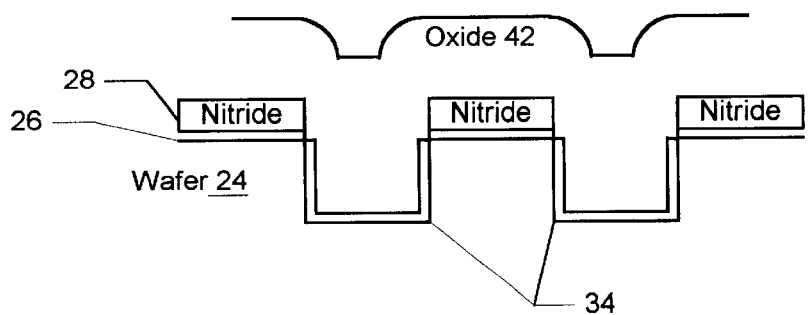

According to the present invention, the optimized oxide deposition process begins in step 58 by reducing the number of wafers 24 placed in the LPCVD chamber from 200 to less than approximately 150, and placing the wafers 24 into chamber on a quartz boat 32 that has an increased slot size of approximately 6.35 mm, rather than 5.2 mm (FIG. 3D). The quartz boat 32 is also centered in the CVD chamber 30 in step 60 so that all 150 wafers are located in the center section of the chamber 30, thus minimizing the temperature gradient (FIG. 3D). Oxide gas 34 is then injected into the chamber 30 and onto the wafers 24 in step 62, thereby providing an oxide layer 42 on the wafer 24 having a substantially uniform thickness from wafer edge to wafer center (FIGS. 3D and 3E).

Figure 3F:
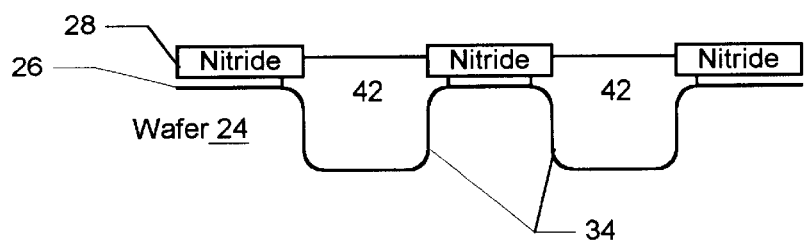

According to the present invention, after the uniform oxide deposition, an optimized polishing process is performed on the oxide 42 in step 64 to polish the oxide 42 down so that its top surface in the trenches 34 is approximately level with the nitride mask 28 (FIG. 3F). In accordance with the present invention, the polish process is optimized by adjusting the process to remove more oxide 42 from the edge area of the wafer 24 than the center area to compensate for any existing oxide non-uniformity resulting from the oxide deposition. In a preferred embodiment, the polish process can be done on a rotary or liner polish platform. By increasing the pressure from a standard 24 psi to an increased pressure of 5–7 psi at the edge for a wafer having an 80–100 mm radius, the removal rate at the edge can be increased, helping residual nitride issue. With a hard planarizing pad, such as IC1000 solo pads, the planarization remains unaffected due to the differential pressure across the wafer.

The polishing processes ceases when a thin skin of oxide 42 is left on top of the nitride 28. In a preferred embodiment, the polishing process ceases when approximately 100–300 angstroms of oxide remains on top of the nitride 28. Next a wet etch, preferably an HF dip, is performed to remove this thin skin of oxide 24 in step 66. Because of the uniformity of the oxide 42 layer after the optimized polish and dip, the present invention ensures that virtually all of the oxide 42 is removed over the nitride 28 in the edge area of the wafer 24.

Figure 3G:
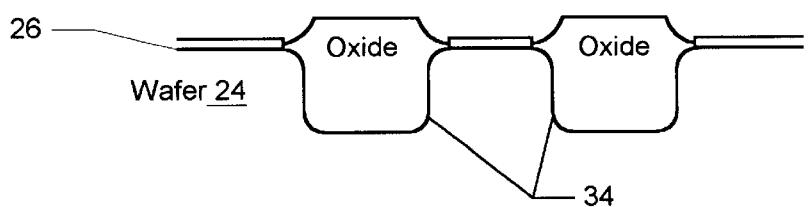

After the optimized polishing process, the nitride 28 is stripped from the wafer 24 in step 66 by a wet etch, preferably using phosphoric acid (FIG. 3G). Because substantially all of the oxide has been removed in the previous steps, the phosphoric acid removes all of the nitride 28 from the wafer 24, thereby minimizing, if not eliminating, any nitride residue.

A method for performing minimizing nitride residue from a silicon wafer during semiconductor device fabrication. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

What is claimed is:

1. A method for reducing nitride residue from a silicon wafer during semiconductor fabrication, the wafer including a nitride mask defining active regions and isolation regions wherein the isolation regions are formed by trenches, the method comprising the steps of:

(a) performing an optimized oxide deposition process wherein a temperature gradient of a CVD chamber is improved by performing the steps of;

(i) placing at least one silicon wafer into the chamber on a quartz boat having a slot size of at least approximately 6 mm, and (ii) centering the quartz boat in approximately a center of the chamber so that at least one wafer is located in a center section of the chamber such that when oxide gas is injected onto the wafer, an oxide layer having a substantially uniform thickness is formed on the wafer; and (b) performing an optimized polishing process on the oxide wherein the oxide is polished down to approximately a level of the nitride, such that more of the oxide is removed from an edge area of the wafer than a center area; and (c) stripping the nitride from the wafer wherein because all of the oxide has been removed, substantially all of the nitride is removed from the thereby minimizing nitride residue.

2. The method of claim 1 wherein step (b) further includes the steps of:

(i) using a standard polishing pressure of 2–4 in the center area of the wafer, (ii) increasing polishing pressure to approximately 5–7 psi in the edge area of the wafer to increase removal rate in the edge area, and (iii) performing the polishing using a hard planarizing pad, such that planarization remains unaffected due to the differential pressure across the wafer.

3. The method of claim 1 wherein step (b) further includes the step of: ceasing the polishing process when a thin skin of oxide having a thickness of approximately 100–300 angstroms is left on top of the nitride.

4. The method of claim 3 wherein step (b) further includes the step of: performing a wet etch to remove thin skin of oxide from the nitride.

5. The method of claim 1 wherein step (a)(i) further includes the step of: providing a quartz boat having a slot size of at least approximately 6.35 mm.

6. The method of claim 1 wherein step (c) further includes the step of: stripping the ride with phosphoric acid.

* * * * *

UNITED STATES PATENT AND TRADEMARK OFFICE
CERTIFICATE OF CORRECTION

PATENT NO. : 6,605,517 B1
DATED : August 12, 2003
INVENTOR(S) : Jayendra D. Bhakta, Krishnashree Achuthan and Angela Hui It is certified that error appears in the above-identified patent and that said Letters Patent is hereby corrected as shown below:

<u>Column 5,</u>
Line 14, before "thereby" please insert -- wafer, --.

<u>Column 6,</u>
Line 18, please replace "ride" with -- nitride --.

Signed and Sealed this

Ninth Day of December, 2003

JAMES E. ROGAN
*Director of the United States Patent and Trademark Office*